United States Patent [19]

Lee et al.

[11] Patent Number: 4,897,860
[45] Date of Patent: Jan. 30, 1990

[54] PROGRAMMABLE TIME BASE CIRCUIT WITH PROTECTED INTERNAL CALIBRATION

[75] Inventors: Robert D. Lee, Denton; Donald R. Dias, Carrollton, both of Tex.

[73] Assignee: Dallas Semiconductor Corporation, Dallas, Tex.

[21] Appl. No.: 163,279

[22] Filed: Mar. 2, 1988

[51] Int. Cl.$^4$ .................... H03K 21/00; H03K 23/00; G04C 3/00
[52] U.S. Cl. ........................................ 377/52; 377/30; 377/55; 307/202.1
[58] Field of Search ........................ 377/29, 30, 44, 52, 377/55, 47, 107, 110, 116, 118, 119; 307/202.1; 365/96; 331/44, 175, 177 R, 179

[56] References Cited

U.S. PATENT DOCUMENTS

| | | | |
|---|---|---|---|
| 3,895,486 | 7/1975 | Hammer et al. | 307/202.1 |
| 3,982,199 | 9/1976 | Green | 377/107 |
| 4,015,208 | 3/1977 | Hammer et al. | 377/52 |
| 4,140,970 | 2/1979 | Graziano | 377/47 |
| 4,199,726 | 4/1980 | Bukosky et al. | 307/202.1 |
| 4,218,871 | 8/1980 | Moritani et al. | 377/52 |
| 4,330,751 | 5/1982 | Swain | 377/52 |
| 4,446,534 | 5/1984 | Smith | 365/96 |
| 4,523,271 | 6/1985 | Levien | 364/200 |
| 4,716,586 | 12/1987 | Bauer | 364/200 |

Primary Examiner—John S. Heyman
Assistant Examiner—Tai V. Duong
Attorney, Agent, or Firm—Worsham, Forsythe, Sampels & Wooldridge

[57] ABSTRACT

A timeout circuit with internal calibration includes an oscillator (11) for generating an initial frequency for division by a modulo-n counter (20). The counter (20) receives the value of n from a calibration register (22) and divides the frequency of the oscillator by the value of n. A gate (26) prevents alteration of the contents of the register (22). The output of the counter (20) provides a calibrated frequency which is further divided by a day counter (32) for output to a countdown counter (34). The countdown counter (34) provides a predetermined countdown of the signal output by the day counter (32) and, at the end of the count, generates a Timeout signal. The predetermined countdown value is determined by a value stored in a register (36) which can be protected by a customer lock out circuit (42).

20 Claims, 4 Drawing Sheets

PROGRAMMABLE TIME BASE CIRCUIT WITH PROTECTED INTERNAL CALIBRATION

TECHNICAL FIELD

The present invention pertains in general to time base circuits and, more particularly, to a time base circuit having an analog oscillator with a protected internal digital calibration circuit and a programmable output.

CROSS-REFERENCE TO OTHER APPLICATIONS

Reference is made to a first commonly owned application entitled "ELECTRONIC KEY LOCKING CIRCUITRY," Ser. No. 163,281, filed 03/02/88 in the name of Robert D. Lee, et al., to a second commonly owned application entitled "FUSING AND DETECTION CIRCUIT", Ser. No. 163,082 filed 03/02/88, in the name of Lee, Robert D.; to a third commonly owned application entitled "ESD RESISTANT LATCH CIRCUIT," Ser. No. 163,280 filed 03/02/88, in the name of Dias, Donald R; and to a fourth commonly owned application entitled "RANDOM NUMBER GENERATOR", Ser. No. 83,583, filed 08/10/88 in the name of Dias, Donald R.

BACKGROUND OF THE INVENTION

Time base circuits have been utilized for a number of years as the core of most electronic systems. These circuits can either be utilized to provide clock circuits or to provide a pulse at periodic intervals, among other applications. One type of circuit that utilizes the periodic interval type of time base is a "Timeout" circuit. Timeout circuits are typically preset to a predetermined time in an internal counter circuit, and an internal oscillator counts down from the preset time reference to zero time when an output pulse is provided. If the preset pulse is again received, the circuit then repeats this operation. At the heart of these circuits is a clock that determines the rate at which the counter operates.

One application for a Timeout circuit is a software protection key system. In this type of system, a supplier presets the Timeout circuit for a predetermined time. The Timeout circuit thus has a predetermined countdown duration and a Timeout pulse is produced after this duration. This Timeout pulse provides a signal to the software key that is utilized to invalidate the key and renders it useless. For example, a supplier or provider of the software key may wish to allow an individual access to a certain software system for a predetermined number of days. Once preset, the Timeout circuit allows the key to operate for this predetermined number of days, after which operation of the software key is inhibited.

One disadvantage to a Timeout circuit is the inherent accuracy of the circuits utilized to realize the Timeout circuit. Typically, some type of analog time base oscillator is utilized, which output is then divided down to give a relatively long time base. The dividing circuits are typically digital circuits which, of course, are very accurate. However, by comparison, the analog time base has inherent inaccuracies due to fabrication tolerances, power supply levels, etc., which directly affect the operation of the circuit. Typically, the fabrication tolerances in an analog oscillator are accounted for by trimming either the value of a resistor or the value of a capacitor that is associated with the timing components in the oscillator. Trimming has some inherent disadvantages in that conventional techniques are expensive to implement and require relatively sophisticated test procedures and/or circuit design techniques. Additionally, these trimming techniques are normally performed during test on an ideal power supply, which has a voltage level that may differ from that actually used in the Timeout circuit during operation in a specific application.

In view of the above disadvantages, there exists a need for a time base circuit which can be utilized as a Timeout circuit, which does not require expensive trimming techniques, and which provides a frequency that does not vary appreciably as a function of the power supply level.

SUMMARY OF THE INVENTION

An apparatus for generating a time base circuit with internal calibration according to the present invention includes an analog oscillator for generating an output signal having a predetermined operating frequency. The operating frequency is input to a programmable counter that divides the operating frequency by a factor of n. A storage register is provided for receiving and storing the value of n for interface to the programmable counter. A reference frequency is generated from the programmable counter and the value of n is inhibited from being altered after storage thereof.

In yet another embodiment of the present invention, a presettable countdown counter is provided for receiving the reference frequency and then counting the cycles thereof for a predetermined count value. The predetermined count value is stored in a discrete register and, after storage thereof, alteration of the contents of the discrete register is inhibited. At the end of the count, a Timeout signal is generated.

In yet another embodiment of the present invention, an internal battery is provided that powers the oscillator (and therefore the operating frequency of the oscillator may be dependent upon the battery voltage). The battery voltage also provides power for the storage of the value of n for the programmable counter and the count value of the countdown counter.

In a further embodiment of the present invention, a watchdog timer circuit is provided for detecting if the oscillator is stopped or the output frequency thereof altered outside a predetermined window. If the output of the oscillator is inhibited or altered, the Timeout signal is generated and the countdown counter is reset.

BRIEF DESCRIPTION OF THE DRAWINGS

For a more complete understanding of the present invention and the advantages thereof, reference is now made to the following description taken in conjunction with the accompanying Drawings in which:

FIG. 4 illustrates a logic diagram of a day counter; and

DETAILED DESCRIPTION OF THE INVENTION

Figure 1:
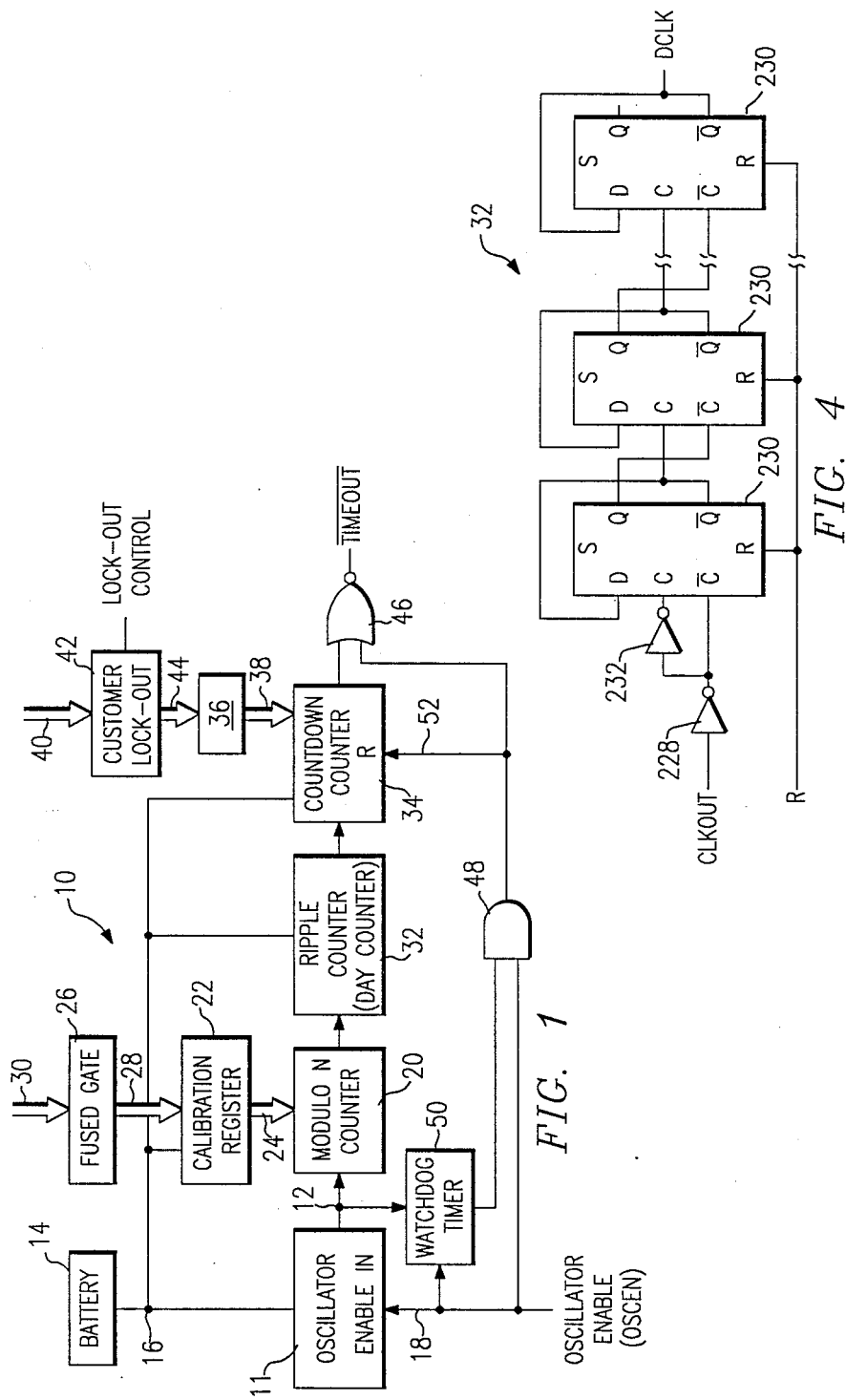
FIG. 1 illustrates a schematic diagram of a time base circuit utilized for a Timeout circuit.

Referring now to FIG. 1, there is illustrated a schematic block diagram of a time base circuit 10 according to the present invention. The time base circuit 10 utilizes an analog oscillator 11 which is operable to generate a frequency on the output thereof of approximately 1 KHz in the preferred embodiment. However, the oscillator 11 could operate at any frequency. This is provided on an output node 12. The oscillator 11 receives its power from an internal battery 14 which supplies battery power to a node 16. The oscillator 11 is also operable to receive an oscillator enable signal OSCEN on an input line 18, which enable signal initiates operation of the oscillator 11, as will be described in more detail hereinbelow.

The output of the oscillator 11 is input to a modulo N counter 20. The modulo N counter 20 is programmable in accordance with the data stored in a calibration register 22. The contents of the calibration register 22 are input to the modulo N counter 20 on a bus 24. The contents of the calibration register 22 are input thereto through a fuse gate circuit 26 which is interfaced with the register 22 through a bus 28. The fuse gate circuit 26 is connected to exterior circuitry (not shown) through a bus 30.

The modulo N counter 20 is operable to be programmed to output a stable clock frequency that has a period equal to 82.4 ms in the preferred embodiment. This is a calibrated output that compensates for any variations in the frequency of the oscillator 11. As will be described in more detail hereinbelow, the battery 14, which, in the preferred embodiment, is a lithium battery internal to the system, is connected to the oscillator 11 during manufacture, and the frequency of the oscillator 11 is measured during calibration. The appropriate value for "N" which is the number to be programmed into the Modulo N counter 20 is then determined and input to the calibration register 22. Additional tests are then performed and then the fuse gate 26 is opened to inhibit further alteration of the value of "N." This is a manufacturer calibration and cannot be changed by a customer nor can it be changed by the manufacturer, since the fuse is permanently opened. This is described in more detail in pending application entitled "ELECTRONIC KEY LOCKING CIRCUITRY," Ser. No. 163,281, filed in the name of Robert D. Lee, et al., which describes the overall system aspects.

It should be noted that the battery voltage of the battery 14 is the voltage that the system will see in the field during operation. This is to be compared with a calibration system wherein calibration is performed on a test bench using a power supply voltage which may be different than the test voltage. Since the battery used to calibrate the system is in fact the same battery utilized during operation of the system, there is minimal deviation of the oscillator frequency on the output node 12 which might otherwise be caused by a change in the battery voltage. As is described in detail hereinbelow, the modulo N counter 20 provides a method to calibrate the output of the oscillator 11 to provide a stable output frequency that compensates for variations incurred during fabrication of the oscillator 11 and variations of the battery voltage that is applied to node 16.

The output of the modulo N counter 20 is input to a twenty-bit ripple counter 32, which ripple counter 32 provides an output frequency that has a period equal to one day. This is therefore referred to as the "day counter." The output of the ripple counter 32 is then input to a countdown counter 34 which is a counter that is programmable by the customer and provides a division factor of anywhere from one to 512. The division factor is stored in a count set register 36 which is interfaced with the countdown counter 34 through a bus 38. (The count set register 36 and bus 38 are actually merged with the countdown counter 34, as shown in the more detailed drawing of FIG. 5.) The customer inputs the data that determines the division factor of the countdown counter 34 through a bus 40 which passes through a customer lock-out circuit 42 and into the count set register 36 through a bus 44. The customer lock-out circuit 42 is a gate which is controlled by a lock-out control signal.

In operation, the customer typically will input the division factor or count value into the count set register 36 and then activate the lock-out control signal. This will provide a predetermined countdown factor for countdown counter 34. This feature is also described in pending application entitled "ELECTRONIC KEY LOCKING CIRCUITRY", Ser. No. 163,281, filed in the name of Robert D. Lee, et al. concurrent with the present application.

To help ensure that the entire system operates at a predetermined frequency and that the various calibration factors used to set the calibrated output frequency of the modulo N counter 20 and the count values for the countdown counter 34 are not disturbed, the battery node 16 is also connected to the calibration register 22, the ripple counter 32 and the countdown counter 34. This operational protection will be described in more detail hereinbelow.

The output of the countdown counter 34 is input into one input of a NOR gate 46, the output of which provides the inverse of the Timeout or Timeout-bar signal. The other input to the NOR gate 46 is connected to the output of an AND gate 48. The AND gate 48 has one input of which is connected to the oscillator enable signal on line 18 and the other input of which is connected to the output of a watch dog timer circuit 50. The watch dog timer circuit 50 has two inputs, one input of which is connected to the oscillator enable line 18 and the other input of which is connected to the output of the oscillator 11. The watch dog timer circuit 50 is operable during operation of the oscillator 11 to determine if the oscillator is working. If the oscillator 11 is determined not to be cycling for a predetermined duration of time, the watch dog timer circuit 50 changes the output thereof to a high logic level, thus causing the output of the AND gate 48 to go high. This is input to a reset input on countdown counter 34 through a line 52, which signal resets countdown counter 34 to a zero value, simulating a Timeout function. This causes the voltage on the Timeout-bar output to change states as if the countdown counter 34 had timed out. Thus, if an unauthorized operator tries to bypass the security feature of limiting the amount of time that the associated circuitry, such as a software protection key system, is operative, the watchdog timer circuit 50 will cause the time base circuit 10 to timeout within a few cycles of when the oscillator circuit 11 stopped.

Once the time base circuit 10 has timed out, there is no way to reset the counter 34 to an initial count if the customer lock out has been set. If the fuse gate circuit 26 has been set by the circuit manufacturer before shipment to the original equipment manufacturer (OEM), the OEM sets the days in the countdown counter 34 and then the OEM sets the customer lock out 42. Once the fuse gate circuit 26 has been set, the customer lockout 42 cannot be unlocked once it is locked. Also, customer lockout comes up locked on power up, so disconnecting of battery 14 does not unlock the customer lockout 42. The combination of the oscillator 11, modulo N counter 20 and ripple counter 32 provide a time base of one day. This output is then input to the countdown counter 34 that is initiated at a presettable value and then counts down to a value of zero. When it reaches a value of zero, the output changes state and the countdown counter ceases to count. This provides the Timeout function of the circuit of FIG. 1.

Figure 2:
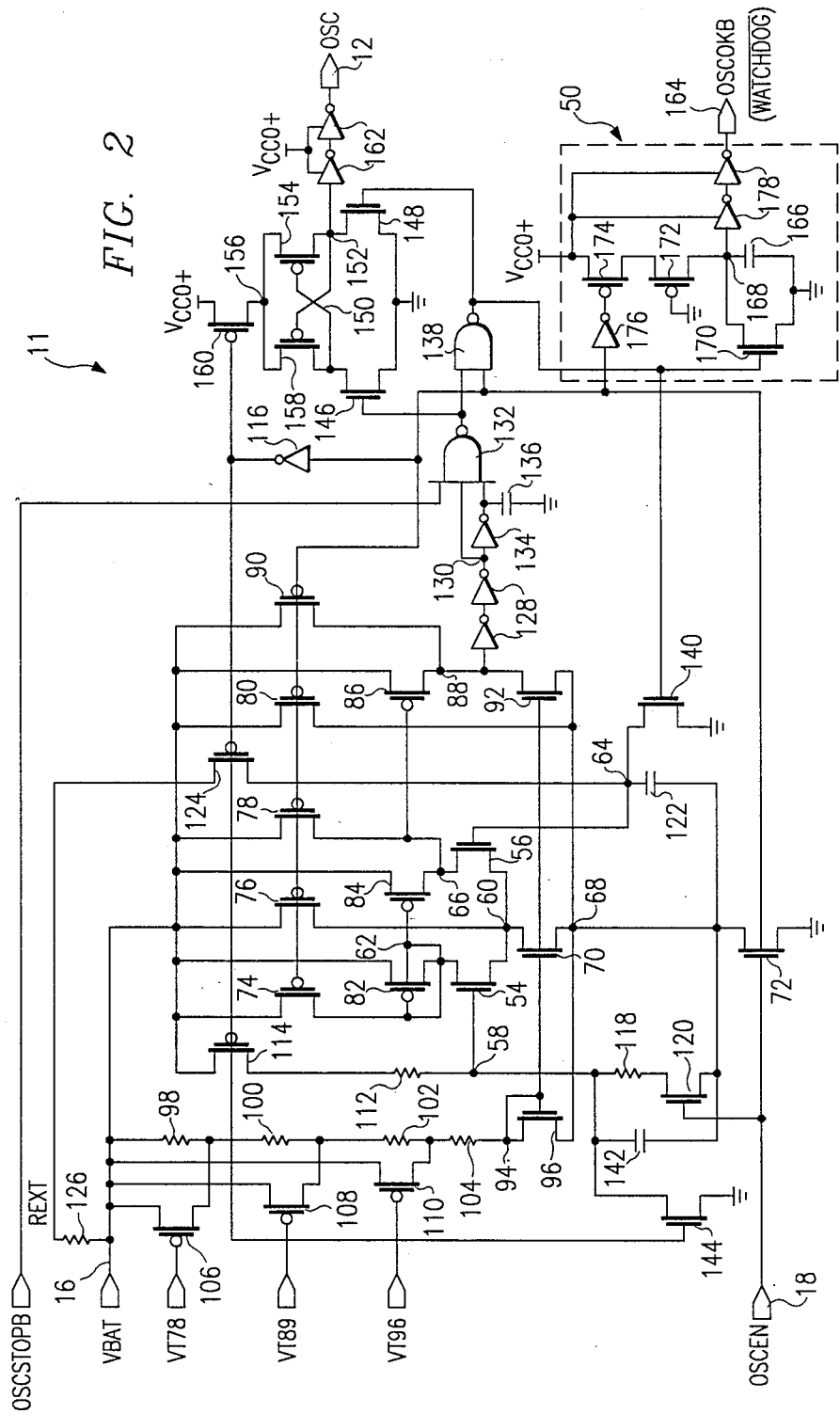
FIG. 2 illustrates a schematic diagram of an analog oscillator.

Referring now to FIG. 2, there is illustrated a detailed schematic diagram of the analog oscillator 11, wherein like numerals refer to like parts in the various figures. The oscillator 11 is basically configured of a comparator which utilizes two differential N-channel transistors 54 and 56, transistor 54 representing the negative input and transistor 56 representing the positive input. The transistor 54 has the gate thereof connected to a node 58, the source thereof connected to a node 60 and the drain thereof connected to a node 62. Transistor 56 has the gate thereof connected to a node 64, the source thereof connected to the node 60 and the drain thereof connected to a node 66. Node 60 is connected to a node 68 through the source-to-drain path of an N-channel transistor 70. Node 68 is then connected to ground through the source-to-drain path of an N-channel transistor 72.

Node 62 is connected to the battery node 16 through a P-channel transistor 74. Nodes 60, 66 and 68 are also connected to battery node 16 through P-channel transistors 76, 78 and 80, respectively. The gates of transistor 74–80 are connected to the oscillator enable terminal 18 which, when at a logic high voltage, renders the transistors 74–80 non-conducting. The operation of these transistors will be described in more detail hereinbelow.

In the operating mode with the oscillator signal OSCEN at a logic high voltage, node 62 is connected through a P-channel load transistor 82 to the battery node 16 with the gate of transistor 82 connected to the drain thereof, and the source of transistor 82 connected to the battery node 16. In a similar manner, node 66 is connected through the source-to-drain path of a P-channel transistor 84 to the battery node 16 with the gate of transistor 66 connected to node 62. Node 66 represents an output node; which node drives the gate of a P-channel transistor 86, the source of which is connected to the battery node 16 and the drain of which is connected to a node 88. Node 88 is connected through the source-to-drain path of a P-channel transistor 90 to the battery terminal 16, the gate of transistor 90 being connected to the oscillator enable terminal 18 and operating similar to transistors 74–80. Node 88 is also connected to node 68 through the source-to-drain path of an N-channel transistor 92, the drain of which is connected to node 88, the source of which is connected to node 68 and the gate of which is connected to a node 94. Node 94 is connected to the gate of transistor 70 and to the drain and gate of an N-channel transistor 96. Transistor 96 has the drain thereof connected to node 68 and operates as a portion of a current mirror.

Transistor 96 operates as a current source and is mirrored over to transistors 70 and 92. A series resistance is provided between the battery terminal 16 and the node 94 with four series connected resistors 98, 100, 102 and 104. For selection purposes, a P-channel transistor 106 is connected between battery node 16 and the junction of transistors 98 and 100, a P-channel transistor 108 is connected between the battery node 16 and the junction of transistors 100 and 102. A P-channel transistor 110 is connected between the battery node 16 and the junction of transistors 102 and 104. Transistors 106–110 provide the capability to select a series configuration equal to the series combination of all four resistors 98–104 or 100–104 or 102–104 alone. This provides an adjustment to the overall current drawn by the oscillator 11.

The negative input terminal of the comparator on the gate of transistor 54 is connected to a voltage divider provided by a first series resistor 112 connected between node 58 and the battery node 16 through the source-to-drain path of a P-channel transistor 114. The gate of P-channel transistor 114 is connected through an inverter 116 to the oscillator enable terminal 18. The second portion of the voltage divider is provided by a series resistor 118, which is connected between the node 58 and a node 68 through an N-channel transistor 120. Transistor 120 has the gate thereof connected to the oscillator enable terminal 18. When the OSCEN signal is high, transistor 114 and transistor 120 conduct, thus placing resistors 112 and 118 between the battery terminal 16 and ground through transistor 72. The resistance of transistors 114, 120, and 72 when they are on are each much less than the resistance of resistor 112 or resistor 118.

The positive input terminal of the comparator on the gate of transistor 56 is switchably connected to ground through a timing capacitor 122, which capacitor has one end thereof connected to node 64 and the other end thereof connected to node 68, node 68 being connected to ground through transistor 72 when the oscillator enable signal is high on terminal 18. Node 64 is also connected through a P-channel transistor 124 to an external resistor 126, which resistor 126 has the other end thereof connected to the battery node 16. The gate of transistor 124 is connected to the output of inverter 116, such that transistor 124 conducts when the oscillator enable (OSCEN) signal is high. It should be noted that when the oscillator enable signal 18 is low, all of the nodes in the comparator circuit are pulled high. This is important in that the comparator starts at a predetermined voltage on the output thereof and to assure that the same bias conditions are placed on matched transistors (e.g., current mirror) so that any $V_T$ or other parametric drifts due to aging will track on matched transistors.

The output of the comparator on node 88 is connected through two series inverters 128 to a node 130. Node 130 is connected to one input of a three input NAND gate 132 and also through an inverter 134 to a second input of NAND gate 132. A capacitor 136 is connected between the output of inverter 134 and ground. The third input of NAND gate 132 is connected to an external signal OSCSTOPB, which signal provides an external oscillator halting function The NAND gate 132 has the output thereof connected to one input of a NAND gate 138, the other input of which is connected to the oscillator enable signal 18, and, therefore, operates as a gate. The output of NAND gate 138 is connected to the gate of an N-channel transistor 140, the source of which is connected to ground and the drain of which is connected to node 64. Transistor 140 is operable to discharge capacitor 122 and provides a feedback path for the oscillator. The NAND gate 132, associated capacitor 136 and inverters 128 and 134 provide a one-shot function which has a period of approximately three microseconds.

A capacitor 142 is connected between Node 58 and node 68 to provide some common mode rejection. Node 58 is also connected to ground through an N-channel transistor 144, the gate of which is connected to the output of inverter 116, such that transistor 144 conducts when the of the oscillator enable (OSCEN) signal on line 18 is at ground potential.

The output of the oscillator 11 at the output of NAND gate 132 and NAND gate 138 is buffered by a level shifting circuit. The level shifting circuit is comprised of two N-channel transistors 146 and 148, each having the sources thereof connected to ground and the gates thereof connected to the output of NAND gates 132 and 138, respectively, and the drains thereof connected to cross-coupled nodes 150 and 152. Node 150 drives the gate of a P-channel transistor 154, transistor 154 having the drain thereof connected to node 152 and the source thereof connected to a node 156. Node 152 drives the gate of a P-channel transistor 158, the source of which is connected to node 150 and the drain of which is connected to node 156. Node 156 is connected through a P-channel transistor 160 to a terminal $V_{CC0}+$. Transistor 160 has the gate thereof connected to the output of inverter 116 such that it conducts when the oscillator enable signal is present on terminal 18 is high. The voltage $V_{CC0}+$ is a voltage that represents the higher of either the battery terminal voltage or the external supply voltage for the chip to which the time base is connected by circuitry not shown in the drawings. This allows the output voltage to be the higher of the two so as not to cause current burn in the gates of transistors driven by the oscillator signal on terminal 12, since these transistors may be powered by $V_{CC}$ potential of up to five volts whereas the signals on the outputs of NAND gates 132 and 138 only rise to a battery potential of approximately three volts. This will not be described as it is described in the co-pending patent application entitled "ELECTRONIC KEY LOCKING CIRCUITRY", Ser. No. 163,281, filed in the name of Robert D. Lee, et al. Node 152 represents the output OSC and is coupled to the terminal 12 and is buffered by two series connected inverters 162.

The watchdog timer 50 circuit is connected between the output of the NAND gate 138 and the OSCOKB signal on an output line 164. The watchdog timer has a timing capacitor 166, which is connected between a node 168 and ground. Node 168 is connected to ground through the source-to-drain path of an N-channel transistor 170, which transistor 170 has the gate thereof connected to the output of NAND gate 138 and conducts every cycle of the oscillator to discharge the capacitor 166. Node 168 is also connected to the terminal $V_{cc0}+$ through two series connected P-channel transistors 172 and 174. Transistor 172 has the gate thereof connected to ground and transistor 174 has the gate thereof connected through an inverter 176 to the oscillator enable signal on terminal 18. Node 168 is connected to terminal 164 through two inverters 178.

In operation, watchdog timer 50 circuit is operable to discharge the capacitor 166 and maintain the output thereof low as long as the oscillator 11 is cycling. However, if a predetermined number of cycles have not occurred, determined by the RC time constant of the two series connected transistors 172 and 174 and the capacitor 166, the output voltage on terminal 164 will increase to a sufficient level to trigger additional logic circuitry described hereinbelow. It is important to note that the watchdog timer circuit 50 is connected after the one shot circuit at the output of NAND gate 132, and as such, the output of NAND gate 138 cannot be held high by manipulating the input pins to the comparator circuit in the oscillator 11 which would cause the output of the watchdog timer circuit 50 to always be low. In addition, when the oscillator enable signal on terminal 18 is low, this will result in transistor 174 being turned off and transistor 170 being turned on. Transistor 170 is turned on due to the fact that NAND gate 138 has a logic high on the output thereof. This combination allows a watchdog timer circuit to be enabled from a starting condition of a low-voltage on the capacitor 166.

Figure 3:
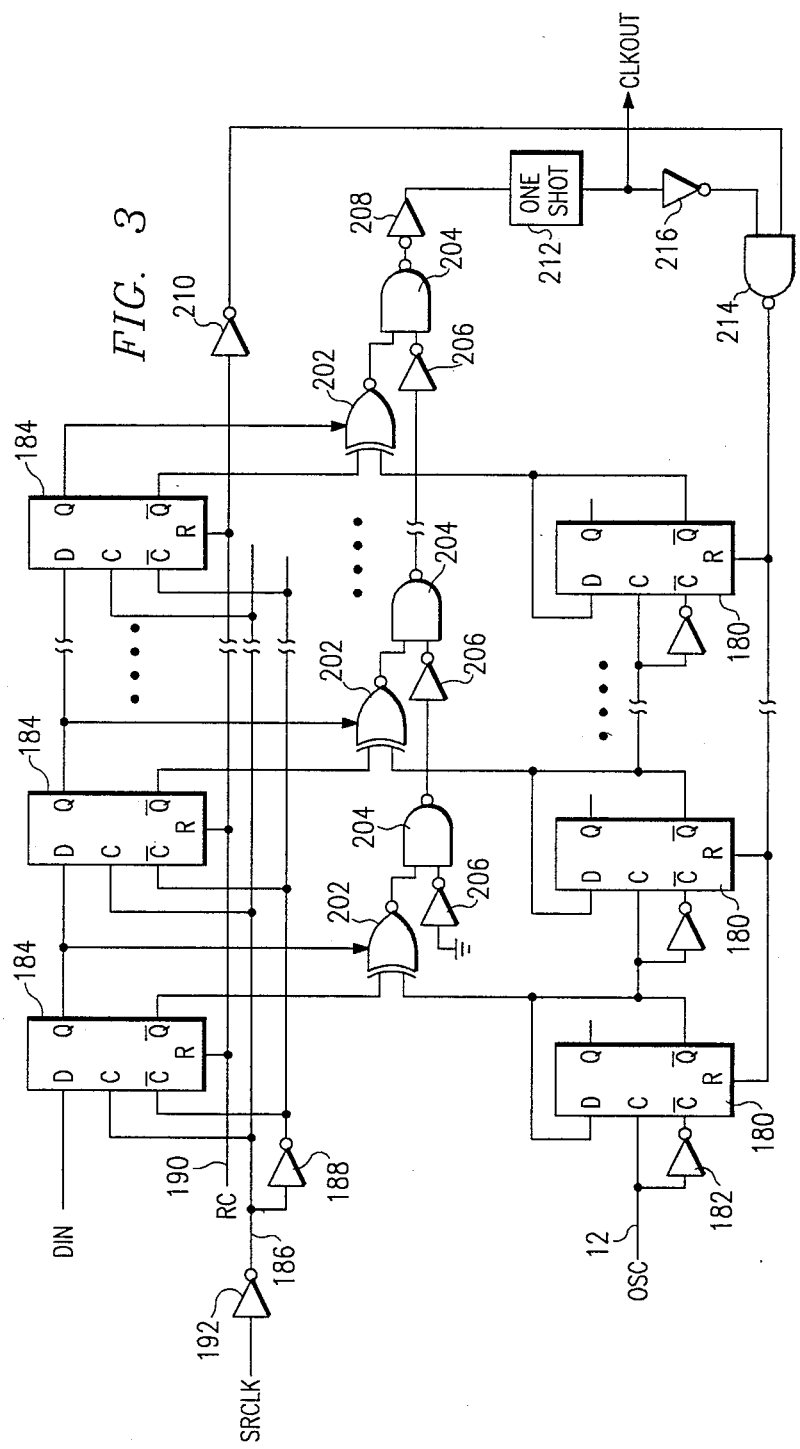
FIG. 3 illustrates a logic diagram of a modulo N counter.

Referring now to FIG. 3, there is illustrated a logic diagram of the modulo N counter 20 and the associated calibration register 22, wherein like numerals refer to like parts in the various figures. The modulo N counter 20 is configured from a plurality of D-type flip flops which are configured to provide a serial binary counter. The flip flops 180 are represented by a reference numeral 180. Each of the flip flops 180 are arranged in a serial configuration with the Q-bar output connected to the clock input of the next sequential D-type flip flop 180. The Q-bar output is also connected back around to the data input of the associated flip flop. The clock input of each of flip flops 180 is connected to the clock bar through an inverter 182. The first flip flop 180 in the serial configuration is connected to the oscillator output OSC on the terminal 12. In the preferred embodiment, there are eight bits or flip flops 180 of Modulo N counter 20.

The calibration register 22 is configured with a plurality of D-type flip flops 184, one flip flop 184 associated with each of the flip flops 180. The D-type flip flops 184 are arranged in a serial configuration to serially clock data therethrough with the Q-output of each flip flop 184 connected to the data input on the next sequential flip flop. The flip flops 184 merely function to store a serial stream of data. The clock input of each of the flip flops 184 is connected to a clock line 186 and the clock-bar input of each of the flip flops 184 is connected to the clock line 186 through an inverter 188. The reset inputs of the flip flops 184 are connected to the signal RC, which is an external reset signal, on line 190, which signal is utilized in the initial set up of the time base circuit.

The clock line 186 is connected through an inverter 192 to the signal SRCLK. This signal allows the clock signal CLK to be passed through to the clock inputs of the flip flops 184 at the appropriate time to load the shift register with data. A serial stream of data DIN is input to the data input of the first of the flip flops 184 in the string. This data is synchronized with the clock signal SRCLK and can be serially fed into the flip flops and stored therein. The flip flops 184, although not shown in FIG. 3, are connected to the battery node 16 to provide a storage function of the battery voltage.

The Q-bar output of each of the flip flops 184 and the Q-bar output of each one of the flip flops 180 that is associated therewith are input to the inputs of an Exclusive NOR gate 202. The Exclusive NOR gate 202 has the output thereof connected to one input of a two-input NAND gate 204, the other input thereof connected to the output of inverter 206. The inverter 206 associated with the first of the associated flip flops 184 and 180 in the serial string has the input thereof connected to ground. Thereafter, the inverter 206 has the input thereof connected to the output of the preceding one of the NAND gates 204. The output of the last of the NAND gates in the serial string is connected to the input of an inverter, which drives the input of a rising edge triggered one shot.

Each of the circuits comprising the exclusive NOR gate 202, the NAND gate 204 and the inverter 206 is operable to function as a detect circuit. Each of the bits stored on the outputs of the flip-flops 184 is compared with the logic state on the output of each of the flip flops 180 associated therewith. When a match exists, the output of the associated Exclusive NOR gate 202 goes high, and, if the preceding bits are also matched, this results in a logic high present on both inputs of the associated NAND gate 204. When a comparison is made for all bits, the output of inverter 208 goes high, indicating the maximum count for the counter.

The output of the inverter 208 is connected to the input of a one-shot 212, which has the output thereof connected to one input of a NAND gate 214 through an inverter 216. The output of the one-shot 212 also comprises the output of the circuit CLKOUT. The other input to the NAND gate 214 is connected to the clock signal RC through an inverter 210. The output of NAND gate 214 is connected to the reset inputs of the flip flops 180.

When the output of the inverter 208 goes high, the output of the one-shot 212 is a high going pulse which resets the flip flops 180 and reinitiates the sequence of counting in flip flops 180. The output of one-shot 212 provides the output signal CLKOUT, which signal clocks the remaining circuits of the chain. The one-shot 212 could be fabricated in a number of different ways, including having inverter 208 cause the output of output of the one-shot 216 to go high and having the output signal cause the output of the one-shot 216 to go low after one half or even one clock cycle.

During calibration, the flip flops 184 are loaded with the appropriate data through the DIN line. However, no data can be input thereto or stored on the outputs of flip flops 184 until a clock signal is present on line 186. This is facilitated by appropriate gating circuitry. Although not shown, this is controlled by a fuse circuit, which fuse circuit is disclosed in pending application entitled "ELECTRONIC KEY LOCKING CIRCUITRY", Ser. No. 163,281, filed in the name of Robert D. Lee, et al concurrent with the present application (and which is hereby incorporated by reference). However, the gating circuit allows independent control of data storage by inhibiting loading thereof during normal operation. This is only accessible by the manufacturer for calibration purposes only. This therefore provides a stable clock output which has a predetermined period which is determined as a function of measuring the output of the oscillator 11 and then storing a predetermined data word in the output of flip flops 184.

Referring now to FIG. 4, there is illustrated a logic diagram of the ripple counter 32, wherein like numerals refer to like parts in the various figures. The signal CLKOUT is input to the input of an inverter 228, the output of which is coupled to the clock input of one of a plurality of flip flops 230 connected in a serial fashion as a binary counter. Each of the flip flops 230 has the Q-bar output thereof connected back to the data input thereof and also connected to the clock input of the next sequential one of the flip flops 230 in the series. The Q-outputs are connected to the clock bar inputs of the next sequential one of the flip flops 230 with the clock input of the first of the flip flops 230 connected through an inverter 232 to the output of inverter 228 and a clock-bar input connected to the output of the inverter 228. The output of the last of the flip flops 230 on the Q-bar output thereof comprises the output signal DCLK, which signal is then input to the countdown counter 34.

Figure 5:
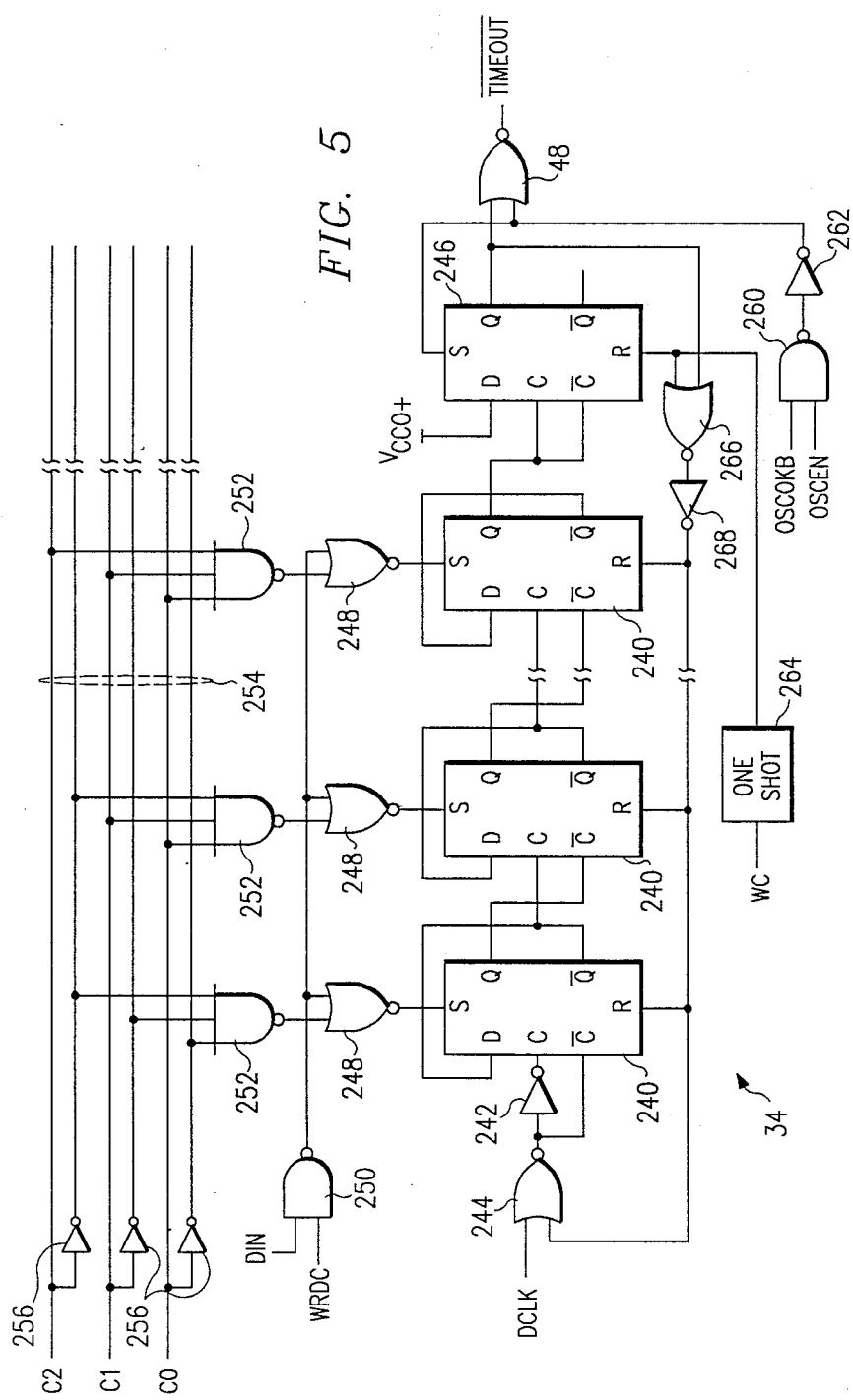
FIG. 5 illustrates a logic diagram of a ripple counter that is presettable to provide a predetermined count.

Referring now to FIG. 5, there is illustrated a logic diagram of the countdown counter 34, count set register 36 and customer lock-out function 42, wherein like numerals refer to like parts in the various figures. The countdown counter 34 is comprised of a plurality of D-type flip flops 240 which are configured in a presettable mode. In the preferred embodiment, the flip flops 240 are set/reset D-type flip flops. The first of the flip flops 240 in the string has the clock input thereof connected through an inverter 242 to the output of a NOR gate 244. The NOR gate 244 is connected to the DCLK signal which is output from the ripple counter 32 of FIG. 4. The other input of the NOR gate 244 is connected to the reset input of the first flip flop 240. The Q-bar output of each of the flip flops in the string is connected back to the data input thereof and also to the clock input of the next sequential one of the flip flops 240. In a similar manner, the Q-output of each of the flip flops is connected to the clock bar input of each of the succeeding flip flops. The Q-bar output of the last of the flip flops 240 and the associated Q-output are connected to the clock and clock bar outputs of a D-type flip flop 246, which is similar to the flip flops 240 with the exception that the D-input thereof is connected to the voltage $V_{CCO}+$.

Each of the flip flops 240 has the set input thereof connected to the output of an associated NOR gate 248. One input of each of the NOR gates 248 is connected to the output of a NAND gate 250. The NAND gate 250 functions to enable the setting of flip flops 240 in response to the presence of a signal WRDC. The other input of each of the NOR gates 248 is connected to the output of a three-input NAND gate 252. The NAND gate 252 functions as a decoder.

The NAND gates 252 associated with each of the flip flops 240 are operable to decode a three-bit word C0, C1, C2. The three-bit C0–C2 are input to a plurality of lines 254, which lines comprise both the true and the false or inverse value of the three-bit word, the inverse value being provided by inverters 256. The interconnections of the three-inputs on the NAND gates 252 provide the decoding function. The three-bit word C0–C2 is generated internally from a counter clocked by the signal CLK. The decoding of C0–C2 successively allows setting of flip flops 240 which are all reset before setting occurs. Note that the counter is an up counter. A countdown function is created by getting the counter to the one's complement of days to be counted down and then counting up to an all one's condition or, more precisely, a roll over to all zero's from an all one's one clock cycle later. The one's complementing of data is accomplished by NAND gate 250 which presents DIN to NOR gates 248 when enabled.

The output of the last or most-significant-bit flip flop 240 is operable to clock the flip flop 246 and latch the high-voltage on the data input to the Q-output thereof. The Q-output thereof is connected to one input of the NOR gate 48, the other input of which is connected to the output of a NAND gate 260 through an inverter 262. The NAND gate 260 and inverter 262 are operable to receive the oscillator enable signal OSCEN and the output of the watchdog timer 50 OSCOKB such that if both signals go high meaning the oscillator is enabled and the watchdog signal has gone high, the input to the NOR gate 48 associated therewith goes high. When the oscillator enable signal OSCEN is high and the output signal OSCOKB from the watchdog timer is low, the output of the inverter 262 remains low. When the OSCOKB signal on the input of NAND gate 260 goes high, the output of inverter 262 goes high which is operable to change the output of NOR gate 46 from a high to a low voltage.

The output of inverter 262 is also input to the set input of flip flop 246, which causes the Q-output thereof to go high when the set input goes high. In operation, as long as the two inputs to the NAND gate 260 are high, the only way for the output signal, which is referred to as Timeout-bar, to go from a logic high to a logic low is for the Q-output thereof to change state from a low to a high. Initially the flip flop 246 is set low by a reset circuit that is connected to the reset input, which signal is a one shot pulsed high at the beginning of the Write Counter mode (WC) of operation. Writing of the counter can be disabled by an input data stream. Additionally, the output of one-shot 264 is connected to the reset inputs of all the flip flops 240 through a series-connected NOR gate 266 and inverter 268. Therefore, writing the counter will first reset all of the flip flops 240 and 246 to logic zero at the Q-outputs thereof. The other input of the NOR gate 266 is connected to the Q-output of the flip flop 246, such that when the counter 34 has "timed out", the remaining flip flops 240 are reset to a zero value (or held at zero value since this is where they are) with the exception of the flip flop 246 which remains at a high value on the Q-output thereof. As long as the high value remains on the Q-output of flip flop 246, the Timeout-bar signal will be low. Thus, Timeout-bar is normally caused by the day counter counting out, but will also be forced to count out if the oscillator 11 stops oscillating when it is disabled——an indication of tampering. Also, flip flop 246 powers up with Q high so that disconnecting and reconnecting the battery (tampering) will cause the part to time out.

In summary, there has been provided a Timeout circuit which includes an analog oscillator for generating an initial operating frequency The oscillator is driven by an internal battery, the oscillator output being a function of the battery voltage. The frequency of the oscillator is then measured and input to a modulo N counter which is interfaced with a calibration register having the value of N stored therein. The value of N is selected to output a predetermined frequency in which variations in the oscillator output frequencies have been compensated for, which variations are due to manufacturing tolerances, battery voltage output, etc. After calibration, the value is then locked into the calibration register and tampering therewith is inhibited. The output of the modulo N counter is an input to a countdown counter, which has a countdown value that is set by an OEM customer. The counter is operable to have the contents protected from tampering once set.

Although the present invention has been described in detail, it should be understood that various changes, substitutions and alterations can be made therein without departing from the spirit and scope of the invention as defined by the appended claims.

What is claimed is:

1. A time base circuit provided with internal calibration, comprising:
    oscillator means for providing an output signal having a predetermined operating frequency;
    programmable counter means for receiving the output of said oscillator means and dividing said operating frequency by a factor of n to provide a reference signal operating at a reference frequency;
    storage means for receiving from an external source the value of n for storage thereof and for interface of the stored value of n with said programmable counter means; and
    inhibit means for inhibiting change of the value of n in said storage means after storage thereof;
    said reference frequency being a calibrated value and determined after measurement of said output signal from said oscillator means, such that said programmable counter means provides an internal calibration capability.

2. The time base of claim 1 and further comprising:
    a presettable countdown counter for receiving on a preset input a predetermined countdown value, said presettable countdown counter operable to receive the output of said programmable counter means and count the cycles of said reference frequency down by said preset countdown value to output a timeout signal at the end of said countdown in said presettable countdown counter;
    count storage means for receiving and storing from an external source said predetermined countdown value for interface with said presettable countdown counter; and
    means for inhibiting change of the value of said predetermined countdown value after storage in said count storage means.

3. The time base circuit of claim 2 wherein said oscillator output is inhibited from initiating said presettable countdown counter until an external oscillator enable signal is received.

4. The time base circuit of claim 3 and further comprising a watchdog timer circuit for determining if said reference signal or said reference frequency is stopped or altered and generating the timeout signal from said presettable countdown counter if said input to said presettable countdown counter is determined to be stopped or said reference frequency input thereto is altered.

5. The time base circuit of claim 1 and further comprising an internal battery for supplying power to said oscillator means and said storage means wherein said operating frequency is a function of said battery voltage.

6. The time base circuit of claim 1 wherein said oscillator means comprises an analog oscillator.

7. The time base circuit of claim 1 wherein said programmable counter means comprises:
    a resettable binary counter having a predetermined number of bits;
    said storage means storing a binary word having a value of n; and
    exclusive or means for comparing each bit of said binary counter with each bit of said stored digital word in said storage means and outputting a signal when a true comparison is received and resetting said binary counter when the count value in said binary counter equals the value stored in the said storage means.

8. A timeout timer with internal calibration, comprising:

an internal battery for providing an internal battery voltage;

oscillator means for providing an output signal having a predetermined operating frequency, said oscillator powered by said internal battery voltage, said operating frequency being dependent upon the voltage level of said internal battery voltage;

programmable counter means for receiving the output of said oscillator means and dividing said operating frequency by a factor of n to provide an output reference signal at a reference frequency;

programming means for programming said programmable counter means and receiving the value of n from an external source and storing the value of n therein;

first inhibit means for inhibiting change in the value of n stored in said programming means;

presettable countdown counter means for receiving a predetermined count value, said presettable counter means operable to receive the output of said programmable counter means and count the cycles of said reference frequency by said predetermined count value and outputting a timeout signal at the end of said count;

register means for receiving and storing from an external source said predetermined count value to interface with said presettable countdown counter means; and second inhibit means for inhibiting alteration of said predetermined count value stored in said register means.

9. The timeout timer of claim 8 wherein said output signal from said oscillator means is inhibited from operating until an external oscillator enable signal is received by said oscillator means.

10. The timeout timer of claim 9 and further comprising means for generating said timeout signal if said oscillator enable signal is removed after generation thereof prior to said presettable countdown counter means counting the cycles of said reference frequency by said predetermined count value.

11. The Timeout timer of claim 8 and further comprising watchdog timer means for determining if the signal to the input of said presettable countdown counter means that was received from said programmable counter means is interrupted or if said reference frequency is altered and generating said timeout signal if the input to said presettable countdown counter means is inhibited or said reference frequency is altered.

12. The timeout timer of claim 8 and further comprising means for generating said timeout signal if said internal battery is disconnected and then reconnected.

13. The timeout timer of claim 8 wherein said programmable counter means and said programming means comprises:

a binary counter having a predetermined number of bits;

a register for storing a binary value having a value of n;

comparison means for comparing each of said bits in said binary counter and each of said bits register stored in said register means and outputting a clock edge for each true comparison;

means for resetting said binary counter when said clock edge is generated by said comparison means such that the counting cycle is started over.

14. The timeout timer of claim 8 wherein said oscillating means comprises an analog oscillator.

15. The timeout timer of claim 14 wherein the said analog oscillator has said operating frequency determined by at least one external timing component which provides at least one component of an RC time constant.

16. A method for providing a time base with internal calibration, comprising the steps of:

generating signal having a predetermined operating frequency;

storing a value of n received from an external source;

inhibiting alteration of the value of n after storage thereof;

dividing the operating frequency by the value of n to generate a reference signal having a reference frequency;

generating an internal battery voltage wherein the operating frequency varies as a function of voltage, the internally generated battery voltage enabling a virtually constant operating frequency; and maintaining storage of the value of n as a function of the uninterrupted presence of said internal battery voltage.

17. The method of claim 16 and further comprising:

storing a predetermined count value;

inhibiting alteration of the predetermined count value after storage thereof; and receiving the reference frequency and counting the cycles thereof for the predetermined count value and generating a timeout signal at the end of the predetermined count.

18. The method of claim 17 and further comprising determining if the operating frequency of the output signal is inhibited or altered and generating the timeout signal if the operating frequency is inhibited or altered.

19. The method of claim 17 and further comprising inhibiting the generation of the output signal until an external oscillator enable signal is received.

20. The method of claim 19 and further comprising generating the timeout signal if the external oscillator enable signal is removed after initiating generation of the output signal.

* * * * *